US012615034B2

(12) United States Patent　　　(10) Patent No.:　US 12,615,034 B2
Nogawa　　　　　　　　　　　　　(45) Date of Patent:　　Apr. 28, 2026

(54) FET DRIVER CIRCUIT

(71) Applicant: Qorvo US, Inc., Greensboro, NC (US)

(72) Inventor: Masashi Nogawa, Sachse, TX (US)

(73) Assignee: Qorvo US, Inc., Greensboro, NC (US)

( * ) Notice: Subject to any disclaimer, the term of this patent is extended or adjusted under 35 U.S.C. 154(b) by 34 days.

(21) Appl. No.: 18/594,207

(22) Filed: Mar. 4, 2024

(65) Prior Publication Data

US 2024/0313746 A1　　Sep. 19, 2024

Related U.S. Application Data

(63) Continuation-in-part of application No. 18/593,396, filed on Mar. 1, 2024.

(60) Provisional application No. 63/452,935, filed on Mar. 17, 2023.

(51) Int. Cl.
　　*H03K 3/013*　　　(2006.01)
　　*H03K 17/60*　　　(2006.01)
　　*H03K 17/687*　　(2006.01)
(52) U.S. Cl.
　　CPC ............. *H03K 3/013* (2013.01); *H03K 17/60* (2013.01); *H03K 17/687* (2013.01)
(58) Field of Classification Search
　　CPC ....... H03K 3/013; H03K 17/60; H03K 17/687
　　See application file for complete search history.

(56) References Cited

U.S. PATENT DOCUMENTS

| | | | | |
|---|---|---|---|---|
| 5,017,816 | A * | 5/1991 | Wilcox .............. | H03K 17/6877 327/578 |
| 5,543,739 | A * | 8/1996 | Bontempo ....... | H03K 17/04123 327/170 |
| 10,917,081 | B1 | 2/2021 | Nguyen et al. | |
| 11,057,029 | B2 | 7/2021 | Westwick et al. | |
| 11,303,273 | B2 | 4/2022 | Shen et al. | |
| 2010/0026257 | A1* | 2/2010 | Huang .................. | H02M 3/158 323/282 |
| 2010/0141326 | A1 | 6/2010 | Tumminaro et al. | |
| 2015/0085403 | A1 | 3/2015 | Santos et al. | |
| 2015/0381167 | A1 | 12/2015 | Sicard et al. | |
| 2018/0069546 | A1* | 3/2018 | Shankar ........... | H03K 17/08122 |

(Continued)

FOREIGN PATENT DOCUMENTS

CA　　　　3116485 A1　　10/2021

*Primary Examiner* — Sibin Chen
(74) *Attorney, Agent, or Firm* — Withrow & Terranova, P.L.L.C.

(57)　　　　　　　ABSTRACT

Embodiments of a power switching system are disclosed. In some embodiments, the system includes: a power transistor having a control terminal, a first transistor terminal, and a second transistor terminal; a current buffer that includes a bipolar junction transistor connected across the control terminal and the first transistor terminal, the bipolar junction transistor having a base; a gate driver circuit having a first circuit branch connected to the base of the bipolar junction transistor and a second circuit branch connected to the base of the bipolar junction transistor, wherein: the first circuit branch includes a first switch for opening and closing the first circuit branch; the second circuit branch includes a second switch for opening and closing the second circuit branch and a current source. In some embodiments, the power transistor is a Silicon Carbide field effect transistor or a Gallium Nitride field effect transistor.

20 Claims, 3 Drawing Sheets

(56)  References Cited

U.S. PATENT DOCUMENTS

Figure 1:
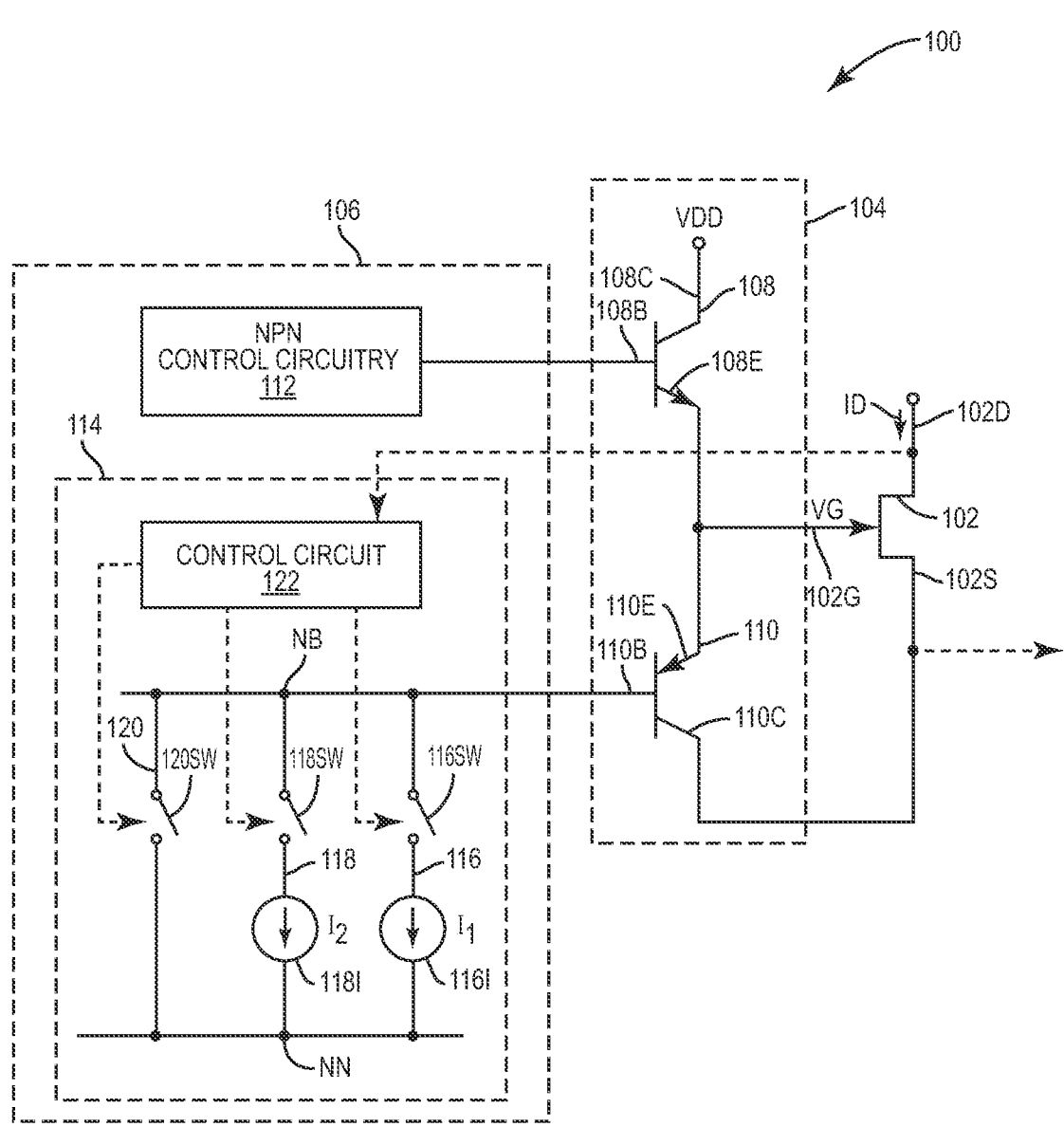

| 2019/0312505 A1 | 10/2019 | Li |
| 2020/0259490 A1 | 8/2020 | Murphy et al. |
| 2021/0305927 A1 | 9/2021 | Kirby et al. |
| 2021/0344342 A1 | 11/2021 | Nojima et al. |
| 2022/0190818 A1 | 6/2022 | Heckroth et al. |
| 2022/0190821 A1 | 6/2022 | Tesu et al. |

* cited by examiner

ABNORMAL "SLOW" OFF $$\frac{\Delta I}{\Delta t} = \frac{500A}{500ns}$$

FET DRIVER CIRCUIT

RELATED APPLICATIONS

This application claims the benefit of provisional patent application Ser. No. 63/452,935, filed Mar. 17, 2023, the disclosure of which is hereby incorporated herein by reference in its entirety.

This application is a continuation-in-part of U.S. patent application Ser. No. 18/593,396, filed Mar. 1, 2024, the disclosure of which is hereby incorporated herein by reference in its entirety.

FIELD OF THE DISCLOSURE

This disclosure relates generally to integrated circuit (IC) devices that drive power transistors.

BACKGROUND

To drive large power transistors using a gate driver, a current buffer is used to provide current amplification. To prevent false on events due to the Miller capacitance once these power transistors are turned off, large Field Effect Transistors (FETs) are used to create a hard off and prevent the power transistor from being turned on incorrectly. These FETs are large and take up a significant amount of space. Thus, what is needed are techniques for preventing false on situations in a power transistor without requiring large FETs.

SUMMARY

In some embodiments, a power switching system includes: a power transistor having a control terminal, a first transistor terminal, and a second transistor terminal; a current buffer that includes a bipolar junction transistor connected across the control terminal and the first transistor terminal, the bipolar junction transistor having a base; a gate driver circuit having a first circuit branch connected to the base of the bipolar junction transistor and a second circuit branch connected to the base of the bipolar junction transistor, wherein the first circuit branch includes a first switch for opening and closing the first circuit branch and the second circuit branch includes a second switch for opening and closing the second circuit branch and a current source. In some embodiments, the power transistor is a Silicon Carbide field effect transistor or a Gallium Nitride field effect transistor. In some embodiments, the power transistor is a field effect transistor, wherein the control terminal is a gate, the first transistor terminal is a source, and the second transistor terminal is a drain. In some embodiments, the bipolar junction transistor is a PNP bipolar junction transistor. In some embodiments, the bipolar junction transistor includes an emitter connected to the gate of the power transistor and a collector connected to the source of the power transistor. In some embodiments, the power switching system further includes a control circuit configured to: close the second switch and open the first switch to turn off the bipolar junction transistor as well as open the second switch and close the first switch to prevent a Miller capacitance of the power transistor from activating the power transistor. In some embodiments, the gate driver circuit further includes a third circuit branch that includes a third switch for opening and closing the third circuit branch and a second current source, wherein the current source in the second circuit branch is a first current source; the first current source generates a first current having a first current level; and the second current source generates a second current having a second current level, wherein the second current level is less than the first current level. In some embodiments, the power switching system further includes a control circuit configured to: detect that the power transistor is to be turned off; close the second switch in the second circuit branch for a first time period in response to detecting that the power transistor is to be turned off and in response to detecting that a drain current of the power transistor is below a threshold current level; close the third switch in the third circuit branch for a second time period in response to detecting that the power transistor is to be turned off and in response to detecting that the drain current of the power transistor is above the threshold current level, wherein the second time period is longer than the first time period. In some embodiments, the current buffer further includes a PNP bipolar junction transistor wherein: the bipolar junction transistor is an NPN bipolar junction transistor the PNP bipolar transistor has a first base, a first collector, and a first emitter, wherein the base is the first base; the NPN bipolar junction transistor includes a second collector and a second emitter and the base is a second base; and the first emitter is connected to the second emitter. In some embodiments, the power transistor is a Silicon Carbide junction field effect transistor (JFET) having a gate, wherein the gate of the Silicon Carbide JFET is connected to the first emitter and the second emitter. In some embodiments, the Silicon Carbide JFET is an N channel field effect transistor (NFET). In some embodiments, the Silicon Carbide JFET includes a source, wherein the source is connected to the first collector. In some embodiments, the first switch is a first complementary metal oxide semiconductor (CMOS) switch and the second switch is a second CMOS switch. In some embodiments, the Silicon Carbide JFET is at least 10 times bigger than the PNP bipolar junction transistor and wherein the Silicon Carbide JFET is at least 10 times bigger than the NPN bipolar junction transistor. In some embodiments, the PNP bipolar junction transistor and NPN bipolar junction transistors are at least 10 times bigger than the first and second CMOS switches. In some embodiments, the gate driver circuit is an integrated circuit (IC). In some embodiments, the current buffer circuit is also part of the IC. In some embodiments, the power switching system is formed in an IC. In some embodiments, the gate driver circuit further includes a third circuit branch having a third switch and a second current source, wherein: the current source is a first current source; and the third circuit branch is connected to the base.

In some embodiments, a power switching system, includes a Silicon Carbide JFET having a gate, a source, and a drain; a current buffer that includes a bipolar junction transistor connected across the gate and the source, the bipolar junction transistor having a base; a gate driver circuit having a first circuit branch connected to the base of the bipolar junction transistor and a second circuit branch connected to the base of the bipolar junction transistor, wherein: the first circuit branch includes a first switch for opening and closing the first circuit branch; and the second circuit branch includes a second switch for opening and closing the second circuit branch and a current source. In some embodiments, the first switch is a CMOS switch, and the second switch is a second CMOS switch. In some embodiments, the Silicon Carbide JFET is at least 10 times bigger than the bipolar junction transistor. In some embodiments, the bipolar junction transistor is at least 10 times bigger than the first CMOS switch and wherein the bipolar junction transistor is at least 10 times bigger than the second CMOS switch. In some embodiments, the power switching system further includes a third circuit branch having a third switch and a second current source, wherein: the current source is a first current source; the first current source generates a first current at a first current level; the second current source generates a second current at a second current level; and the second current level is lower than the first current level. In some embodiments, the first switch is a first CMOS switch, the second switch is a second CMOS switch, and the third switch is a third CMOS switch. In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
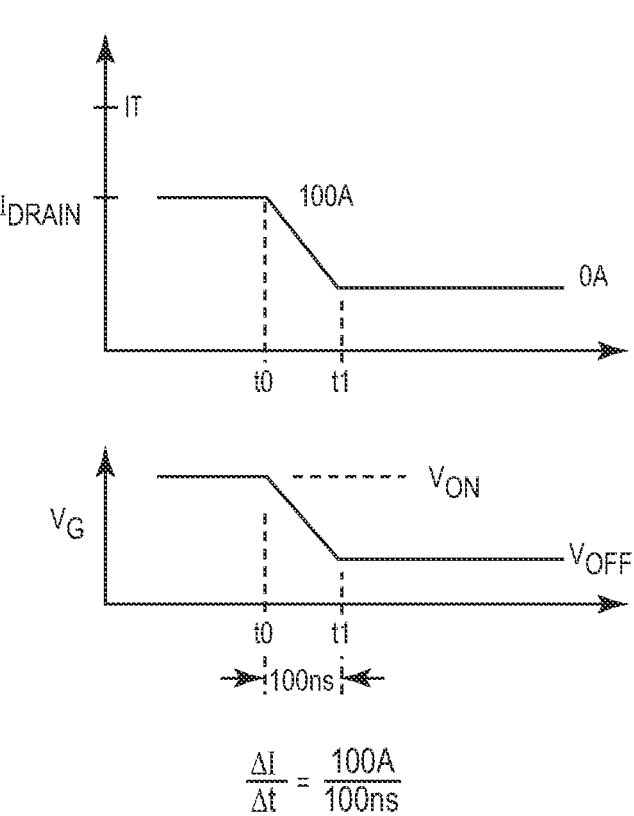
Figure 3:
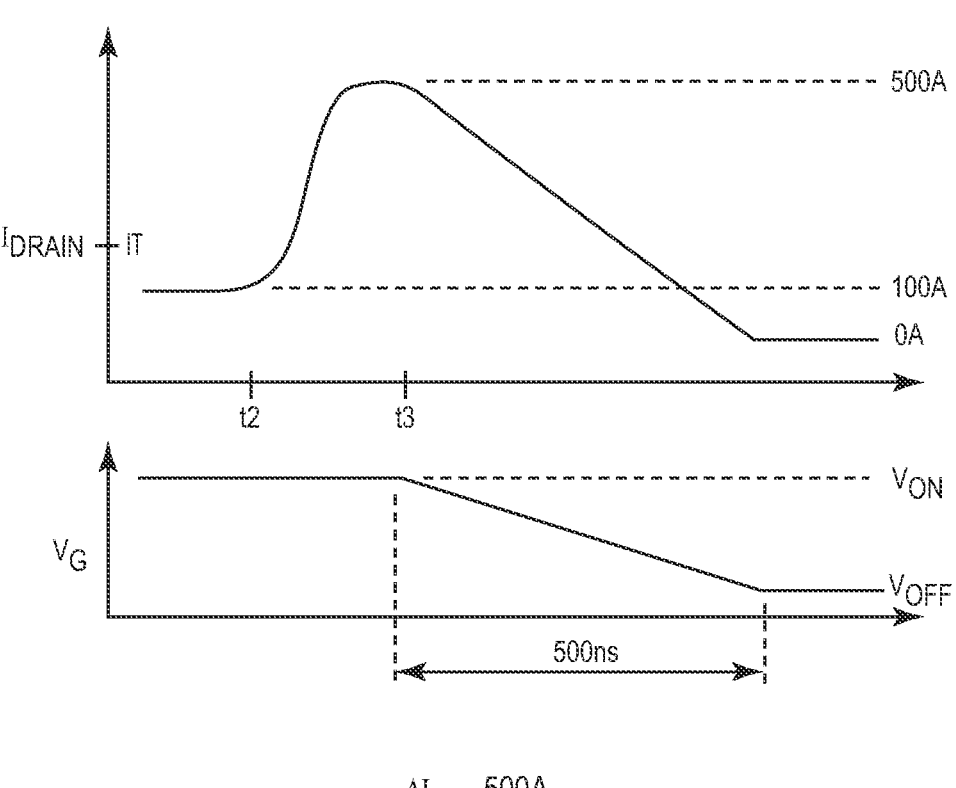

FIG. 1 is an integrated circuit (IC) device, in accordance with some embodiments;

FIG. 2 is a graph of the gate voltage at a gate of a power transistor and a drain current at a drain of the power transistor during a "normal" turn off operation, in accordance with some embodiments; and FIG. 3 is a graph of the gate voltage at the gate of the power transistor and a drain current at the drain of the power transistor during an "abnormal" turn off operation, in accordance with some embodiments.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

FIG. 1 is a power switching system 100, in accordance with some embodiments.

The integrated circuit (IC) device 100 includes a power transistor 102, a current buffer 104, and a gate driver circuit 106. The power transistor 102 is, in general, a large transistor. The power transistor 102 includes a control terminal 102G, a transistor terminal 102D, and a transistor terminal 102S. In this embodiment, the power transistor 102 is a Junction field effect transistor (JFET) and is also an N-channel field effect transistor (NFET). In other embodiments, the power transistor 102 is another type of power transistor, such as a Gallium Nitride field effect transistor. In other embodiments, the power transistor is a P-channel field effect transistor (PFET). Since the power transistor 102 is a field effect transistor (FET), the control terminal 102G is a gate, the transistor terminal 102D is a drain, and the transistor terminal 102S is a source. In some embodiments, the power transistor 102 is used to power components such as electric motors, a DC to DC converter, or an AC to DC converter.

To drive the power transistor 102 without using transistors as large as the power transistor 102, the current buffer 104 is provided to amplify the signals from the gate driver circuit 106. The current buffer 104 creates sufficient current so as to turn on and turn off the power transistor 102. The current buffer 104 includes an NPN bipolar junction transistor 108 and a PNP bipolar transistor 110. The NPN bipolar transistor 108 has a collector 108C, a base 108B, and an emitter 108E. The PNP bipolar junction transistor 110 includes a collector 110C, a base 110B, and an emitter 110E. The collector 110C of the NPN bipolar transistor 108 is configured to receive a power source voltage VDD. The base of the NPN bipolar transistor 108 is connected to NPN control circuitry 112 in the gate driver circuit 106. The NPN control circuitry 112 is provided in accordance with U.S. Provisional Patent Application Ser. No. 63/385,332 named "Adaptive Dead Time Control For Switching Circuitry of a DC Converter" filed Nov. 29, 2022 and U.S. Provisional Patent Application Ser. No. 63/434,189 named "Using Different Voltage Levels to Close a Switch in a Switch Converter" filed Nov. 10, 2022, in accordance with some embodiments. U.S. Provisional Patent Application Ser. No. 63/385,332 named "Adaptive Dead-Time Control for Switching Circuitry of a DC Converter" filed Nov. 29, 2022 and U.S. Provisional Patent Application Ser. No. 63/434,189 named "Using Different Voltage Levels to Close a Switch in a Switch Converter" filed Nov. 10, 2022 are each hereby incorporated by reference in their entireties. The emitter 108E of the NPN bipolar junction transistor 108 is connected to the emitter 110E of the PNP bipolar junction transistor 110. In some embodiments, the power transistor 102 is at least 10 times larger than the NPN bipolar junction transistor 108. In some embodiments, the power transistor 102 is at least 10 times larger than the PNP bipolar junction transistor 110.

The base 110B of the PNP bipolar transistor 110 is connected to a PNP control circuitry 114. The emitter 108E of the NPN bipolar junction transistor 108 and the emitter of the PNP bipolar junction transistor 110 are both connected to the gate 102G of the power transistor 102. Thus, the current buffer 104 operates as a current amplifier that results in a voltage at the gate 102G of the power transistor 102 that controls the operation of the power transistor 102. In some embodiments, the current buffer 104 has a current gain of around 100. The collector 110C of the PNP bipolar junction transistor 110 is connected to the source 102S of the power transistor 102.

The PNP control circuitry 114 includes a circuit branch 116, a circuit branch 118, a circuit branch 120, and a control circuit 122. Each of the circuit branches 116, 118, 120 are connected between a node NB and a node NN. The node NB is connected to the base 110B of the PNP bipolar junction transistor 110. In some embodiments, the node NN is at ground or at a negative voltage. The circuit branch 116 includes a switch 116SW and a current source 116I. The switch 116SW and the current source 116I are connected in series within the circuit branch 116. The switch 116SW is operable to be opened and closed by the control circuit 122 in order to open and close the circuit branch 116. The current source 116I generates a current I1, having a first current level. The circuit branch 118 includes a switch 118SW and a current source 118I. The switch 118SW and the current source 118I are connected in series within the circuit branch 118. The switch 116SW is operable to be opened and closed by the control circuit 122 in order to open and close the circuit branch 118. The current source 118I generates a current I2, having a second current level. The second current level is less than the first current level. The circuit branch 120 includes a switch 120SW. The switch 120SW is operable to be opened and closed by the control circuit 122 in order to open and close the circuit branch 120. In some embodiments, the power transistor 102 is at least 100 times larger than each of the switches 116SW, 118SW, 120SW individually. In some embodiments, the NPN bipolar junction transistor 108 is at least 100 times larger than each of the switches 116SW, 118SW, 120SW, individually. In some embodiments, the PNP bipolar junction transistor 110 is at least 100 times larger than each of the switches 116SW, 118SW, 120SW, individually.

Referring now to FIG. 1 and FIG. 2, FIG. 2 is a graph of the gate voltage VG at the gate 102G of the power transistor 102 and a drain current ID at the drain 102D of the power transistor 102 during a "normal" turn off operation, in accordance with some embodiments.

The top graph illustrates the drain current ID during the "normal" off operation as a function of time, in accordance with some embodiments. The bottom graph illustrates the gate voltage VG as a function of time, in accordance with some embodiments. The "normal" off operation means that the drain current ID at the drain 102D is operating in accordance with typical and normal operational conditions.

To determine whether the drain current ID at the drain 102D is operating in accordance with typical and normal operational conditions, the control circuit 122 is configured to receive a feedback signal from the drain 102D of the power transistor 102. The control circuit 122 is configured to detect whether the drain current ID is less than a threshold current level IT, while the power transistor 102 is on. Here, we assume that the normal current level of the drain current ID while the power transistor 102 is on is 100 Amps. In other embodiments, the power transistor 102 can have any other acceptable value. It is also assumed that 100 Amps is lower than the threshold current level IT.

At time to, the control circuit 122 closes the switch 116SW while the switches 118SW and 120SW remain open in response to the control circuit 122 detecting that the power transistor 102 is to be turned off and in response to detecting that the drain current ID is below threshold current level. Accordingly, at time to, the current I1 generated by the current source 116I begins to turn the power transistor 102 off. In this embodiment, the current level of the current I1 is generated by the current source 116I so that the power transistor 102, which is generating a current of 100 mA, is turned off in 100 nanoseconds. The control circuit 122 keeps the switch 116SW closed for a time period (e.g., 100 nanoseconds) until time t1, when the drain current ID reaches the current level of 0 Amps in order to turn off the power transistor 102. In this example, when the power transistor 102 is turned off in 100 ns, we will have dI/dt slew rate of 1 (A/ns). When a 100 A-range of current is being generated through the drain 102D of the power transistor 102, any wire or printed circuit board trace may have significant parasitic inductance. As a result, an inductive kick-back voltage is generated, which is equal to:

$$V(\text{kickback})=L(\text{parasitic})\times dI/dt.=L\times 1(A/ns)$$

To avoid this kickback voltage becoming bigger and causing unacceptable parasitic inductance, the dI/dt is maintained in a reasonable range and, thus, the time period is sufficient to prevent unacceptable V(kickback). The time period thus ensures that the voltage at the gate 102G is tuned off slowly enough as to not generate unacceptable parasitic inductance.

In response to the time period ending, the control circuit 122 is configured to close the switch 120SW and open the switches 116SW, 118SW.

In some embodiments, the power transistor 102 has a big gate-drain (parasitic) capacitance. This capacitance is referred to as a Miller capacitance. When the drain current ID goes from a 100 A current to a 0 A current during "normal" turn off, the voltage at the drain 102D has a slew rate that generates a transient current. This transient current can cause a false turn on event. To prevent power loss due to this false turn on event, the switch 120SW is closed so that the transient current is absorbed through the PNP bipolar junction transistor 110.

Referring now to FIG. 1 and FIG. 3, FIG. 3 is a graph of the gate voltage VG at the gate 102G of the power transistor 102 and a drain current ID at the drain 102D of the power transistor 102 during a "abnormal" turn off operation, in accordance with some embodiments.

The top graph illustrates the drain current ID during the "abnormal" turn off operation as a function of time, in accordance with some embodiments. The bottom graph illustrates the gate voltage VG as a function of time, in accordance with some embodiments. The "abnormal" turn off operation means that the drain current ID at the drain 102D reaches current levels that are higher than current levels during typical and normal operational conditions.

To determine whether the drain current ID at the drain 102D is operating in accordance with typical and normal operational conditions, the control circuit 122 is configured to receive the feedback signal from the drain 102D of the power transistor 102. The control circuit 122 is configured to detect whether the drain current ID is greater than the threshold current level IT, while the power transistor 102 is on. In this embodiment, the drain current becomes higher than the threshold current level at time t2. The drain current ID continues to rise until the drain current reaches 500 Amps, which is significantly higher than the threshold current level. At time t3, the control circuit 122 detects that the power transistor 102 is to be turned off. Also, at time t3, the control circuit 122 detects that the drain current ID is above the threshold current level.

The control circuit 122 is configured to select the time period for turn off so that the slew rate is equal to the same slew rate during the "normal" turn off operation. Since, in this example, the current level is 500 A, the time period is thus selected to be 500 ns. Accordingly, the control circuit 122 closes the switch 118SW and opens the switches 116SW, 120SW for the time period that results in a matching slew rate. In this example, the current level of the current I2 generated by the current source 1181 is lower than the current level of the current I1 generated by the current source 1161 to drive the gate 102G of the power transistor 102 to be slower. In response to the end of the time period, the control circuit closes the switch 120SW and opens the switches 116SW, 118SW. In some embodiments, the switches 116SW, 118SW, 120SW are Complementary Metal Oxide Semiconductor (CMOS) field effect transistors. As such, the power transistor 102 can be controlled by switches 116SW, 118SW, 120SW, which are much smaller (at least 100 times smaller) than the power transistor 102.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A power switching system, comprising:
a power transistor having a control terminal, a first transistor terminal, and a second transistor terminal, wherein the power transistor is a Silicon Carbide field effect transistor or a Gallium Nitride field effect transistor;
a current buffer that includes a bipolar junction transistor connected across the control terminal and the first transistor terminal, the bipolar junction transistor having a base; and
a gate driver circuit having a first circuit branch connected to the base of the bipolar junction transistor and a second circuit branch connected to the base of the bipolar junction transistor, wherein:
the first circuit branch includes a first switch for opening and closing the first circuit branch; and
the second circuit branch includes a second switch for opening and closing the second circuit branch and a current source.

2. The power switching system of claim 1, wherein, the control terminal is a gate, the first transistor terminal is a source, and the second transistor terminal is a drain.

3. The power switching system of claim 2, wherein the bipolar junction transistor is a PNP bipolar junction transistor.

4. The power switching system of claim 3, wherein the bipolar junction transistor includes an emitter connected to the gate of the power transistor and a collector connected to the source of the power transistor.

5. The power switching system of claim 4, further comprising a control circuit configured to:
close the second switch and open the first switch to turn off the bipolar junction transistor; and
open the second switch and close the first switch to prevent a Miller capacitance of the power transistor from activating the power transistor.

6. The power switching system of claim 4, wherein the gate driver circuit further comprises a third circuit branch including a third switch for opening and closing the third circuit branch and a second current source, wherein:
the current source in the second circuit branch is a first current source;
the first current source generates a first current having a first current level; and
the second current source generates a second current having a second current level, wherein the second current level is less than the first current level.

7. The power switching system of claim 6, further comprising a control circuit configured to:

detect that the power transistor is to be turned off;

close the second switch in the second circuit branch for a first time period in response to detecting that the power transistor is to be turned off and in response to detecting that a drain current of the power transistor is below a threshold current level; and close the third switch in the third circuit branch for a second time period in response to detecting that the power transistor is to be turned off and in response to detecting that the drain current of the power transistor is above the threshold current level, wherein the second time period is longer than the first time period.

8. The power switching system of claim 1, wherein the current buffer further comprises a second bipolar junction transistor, wherein:

the bipolar junction transistor is a PNP bipolar junction transistor;

the PNP bipolar junction transistor has a first base, a first collector, and a first emitter, wherein the base is the first base;

the second bipolar junction transistor is an NPN bipolar junction transistor;

the NPN bipolar junction transistor comprises a second collector and a second emitter and the base is a second base; and the first emitter is connected to the second emitter.

9. The power switching system of claim 8, wherein the power transistor is a Silicon Carbide junction field effect transistor (JFET) having a gate, wherein the gate of the Silicon Carbide JFET is connected to the first emitter and the second emitter.

10. The power switching system of claim 9, wherein the Silicon Carbide JFET is an N channel field effect transistor (NFET).

11. The power switching system of claim 10, wherein the Silicon Carbide JFET includes a source, wherein the source is connected to the first collector.

12. The power switching system of claim 11, wherein the first switch is a first complementary metal oxide semiconductor (CMOS) switch and the second switch is a second CMOS switch.

13. The power switching system of claim 12, wherein the Silicon Carbide JFET is at least 10 times bigger than the PNP bipolar junction transistor and wherein the Silicon Carbide JFET is at least 10 times bigger than the NPN bipolar junction transistor.

14. The power switching system of claim 13, wherein the PNP bipolar junction transistor and the NPN bipolar junction transistor are at least 10 times bigger than the first and second CMOS switches.

15. The power switching system of claim 14, wherein the gate driver circuit is an integrated circuit (IC).

16. The power switching system of claim 15, wherein a current buffer circuit is also part of the IC.

17. The power switching system of claim 14, wherein the power switching system is formed in an integrated circuit (IC).

18. The power switching system of claim 1, wherein the gate driver circuit further comprises a third circuit branch having a third switch and a second current source, wherein:

the current source is a first current source; and the third circuit branch is connected to the base.

19. A power switching system, comprising:

a Silicon Carbide Junction field effect transistor (JFET) having a gate, a source, and a drain;

a current buffer that includes a bipolar junction transistor connected across the gate and the source, the bipolar junction transistor having a base; and a gate driver circuit having a first circuit branch connected to the base of the bipolar junction transistor and a second circuit branch connected to the base of the bipolar junction transistor, wherein:

the first circuit branch includes a first switch for opening and closing the first circuit branch; and the second circuit branch includes a second switch for opening and closing the second circuit branch and a current source.

20. A power switching system, comprising:

a power transistor having a control terminal, a first transistor terminal, and a second transistor terminal;

a current buffer that includes a first bipolar junction transistor connected across the control terminal and the first transistor terminal, wherein the current buffer further comprises a second bipolar junction transistor, wherein:

the first bipolar junction transistor is a PNP bipolar junction transistor;

the PNP bipolar junction transistor has a first base, a first collector, and a first emitter;

the second bipolar junction transistor is an NPN bipolar junction transistor;

the NPN bipolar junction transistor comprises a second collector, a second emitter and a second base; and the first emitter is connected to the second emitter; and a gate driver circuit having a first circuit branch connected to the first base of the first bipolar junction transistor and a second circuit branch connected to the first base of the first bipolar junction transistor, wherein:

the first circuit branch includes a first switch for opening and closing the first circuit branch; and the second circuit branch includes a second switch for opening and closing the second circuit branch and a current source.

* * * * *